(12) United States Patent
Camacho et al.

(10) Patent No.: US 7,868,471 B2
(45) Date of Patent: Jan. 11, 2011

(54) INTEGRATED CIRCUIT PACKAGE-IN-PACKAGE SYSTEM WITH LEADS

(75) Inventors: Zigmund Ramirez Camacho, Singapore (SG); Arnel Trasporto, Singapore (SG); Jeffrey D. Punzalan, Singapore (SG); Abelardo Hadap Advincula, Jr., Singapore (SG)

(73) Assignee: Stats Chippac Ltd., Singapore (SG)

( * ) Notice: Subject to any disclaimer, the term of this patent is extended or adjusted under 35 U.S.C. 154(b) by 51 days.

(21) Appl. No.: 11/854,934

(22) Filed: Sep. 13, 2007

(65) Prior Publication Data

US 2009/0072363 A1 Mar. 19, 2009

(51) Int. Cl.
*H01L 23/495* (2006.01)

(52) U.S. Cl. ......................... 257/790; 257/787; 257/723; 257/678; 257/E23.126

(58) Field of Classification Search ................. 257/723, 257/790, E23.126
See application file for complete search history.

(56) References Cited

U.S. PATENT DOCUMENTS

| | | | |
|---|---|---|---|
| 5,097,317 A * | 3/1992 | Fujimoto et al. | 257/786 |
| 5,523,608 A * | 6/1996 | Kitaoka et al. | 257/433 |
| 5,594,204 A * | 1/1997 | Taylor et al. | 174/527 |
| 5,598,034 A * | 1/1997 | Wakefield | 257/706 |
| 5,770,888 A * | 6/1998 | Song et al. | 257/696 |
| 5,989,940 A * | 11/1999 | Nakajima | 438/127 |
| 6,037,661 A * | 3/2000 | Palagonia et al. | 257/723 |
| 6,146,924 A * | 11/2000 | Chang et al. | 438/126 |
| 6,433,418 B1 * | 8/2002 | Fujisawa et al. | 257/696 |
| 6,569,709 B2 | 5/2003 | Derderian | |
| 6,607,937 B1 | 8/2003 | Corisis | |
| 6,754,407 B2 * | 6/2004 | Chakravorty et al. | 385/14 |
| 6,774,447 B2 * | 8/2004 | Kondo et al. | 257/432 |
| 6,818,999 B2 | 11/2004 | Kikuma et al. | |
| 6,841,859 B1 * | 1/2005 | Thamby et al. | 257/676 |
| 6,852,567 B1 * | 2/2005 | Lee et al. | 438/106 |
| 6,943,457 B2 * | 9/2005 | Smith | 257/790 |
| 6,946,323 B1 | 9/2005 | Heo | |
| 6,949,834 B2 * | 9/2005 | Connell et al. | 257/777 |
| 7,145,253 B1 * | 12/2006 | Kim et al. | 257/790 |
| 7,196,415 B2 * | 3/2007 | Zhong et al. | 257/712 |
| 7,198,980 B2 * | 4/2007 | Jiang et al. | 438/107 |
| 7,241,645 B2 * | 7/2007 | Zhao et al. | 438/122 |
| 7,247,934 B2 * | 7/2007 | Pu | 257/686 |
| 7,288,835 B2 * | 10/2007 | Yim et al. | 257/685 |
| 7,298,038 B2 * | 11/2007 | Filoteo et al. | 257/686 |
| 7,339,280 B2 * | 3/2008 | Chuang et al. | 257/790 |
| 7,381,588 B1 * | 6/2008 | Patel et al. | 438/109 |
| 7,391,101 B2 * | 6/2008 | Takahata et al. | 257/672 |
| 2002/0020923 A1 * | 2/2002 | Kanatake | 257/778 |
| 2003/0090008 A1 * | 5/2003 | Brand | 257/796 |
| 2004/0000703 A1 * | 1/2004 | Lee et al. | 257/675 |
| 2004/0065945 A1 * | 4/2004 | Smith | 257/666 |
| 2004/0084784 A1 * | 5/2004 | Mueller et al. | 257/788 |

(Continued)

*Primary Examiner*—Leonardo Andújar
*Assistant Examiner*—William Harriston
(74) *Attorney, Agent, or Firm*—Mikio Ishimaru

(57) ABSTRACT

An integrated circuit package-in-package system includes: forming an integrated circuit package system including: connecting a first integrated circuit die and a lead, and forming an inner encapsulation covering the first integrated circuit die and a portion of the lead; mounting a second integrated circuit die to the integrated circuit package system; connecting the second integrated circuit die and the lead; and forming a package encapsulation covering the integrated circuit package system and the second integrated circuit die with the lead exposed.

8 Claims, 12 Drawing Sheets

U.S. PATENT DOCUMENTS

| | | | |
|---|---|---|---|
| 2004/0169292 A1* | 9/2004 | James et al. | 257/786 |
| 2005/0127494 A1* | 6/2005 | Liu | 257/696 |
| 2006/0022315 A1* | 2/2006 | Huang et al. | 257/676 |
| 2006/0180911 A1* | 8/2006 | Jeong et al. | 257/686 |
| 2006/0220256 A1* | 10/2006 | Shim et al. | 257/777 |
| 2006/0237832 A1* | 10/2006 | James et al. | 257/678 |
| 2007/0108571 A1* | 5/2007 | Huang et al. | 257/676 |
| 2007/0108582 A1* | 5/2007 | Karnezos | 257/686 |
| 2007/0200205 A1* | 8/2007 | Filoteo et al. | 257/666 |
| 2007/0216005 A1* | 9/2007 | Yim et al. | 257/686 |
| 2007/0228545 A1* | 10/2007 | Ramakrishna et al. | 257/686 |
| 2008/0023816 A1* | 1/2008 | Weng et al. | 257/690 |
| 2008/0029862 A1* | 2/2008 | Filoteo et al. | 257/676 |
| 2008/0029905 A1* | 2/2008 | Merilo et al. | 257/778 |
| 2008/0157319 A1* | 7/2008 | Ha et al. | 257/686 |
| 2008/0157321 A1* | 7/2008 | Camacho et al. | 257/686 |
| 2008/0237825 A1* | 10/2008 | Tay et al. | 257/686 |
| 2008/0272477 A1* | 11/2008 | Do et al. | 257/686 |
| 2008/0308933 A1* | 12/2008 | Tay et al. | 257/738 |

* cited by examiner

INTEGRATED CIRCUIT PACKAGE-IN-PACKAGE SYSTEM WITH LEADS

TECHNICAL FIELD

The present invention relates generally to an integrated circuit package system and more particularly to an integrated circuit package-in-package system.

BACKGROUND ART

Increased miniaturization of components, greater packaging density of integrated circuits ("ICs"), higher performance, and lower cost are ongoing goals of the computer industry. As new generations of IC products are released, the number of devices used to fabricate them tends to decrease due to advances in technology. Simultaneously, the functionality of these products increases.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor die (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact terminals or pads formed directly on the surface of the package.

Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the quad flat package ("QFP"). QFP packages typically comprise a lead frame, such as a conductive sheet stamped and etched, with a semiconductor die having a multitude of bond pads mounted to the top side of the lead frame. Wire bonds electrically connect the bond pads, of the semiconductor die, to a series of conductive lead fingers on the topside of the lead frame. Typically, the semiconductor die and the wire bonds are encapsulated within a molding compound.

In order to reduce manufacturing costs, the electronics industry is increasing the usage of QFP packages. In the manufacturing process, many obstacles must be overcome to deliver extremely small packages with thinner and thinner profile in high volume. Despite the trend towards miniaturization and thinner profile, more functions and more integrated circuits continue to be packed into QFP packages.

Thus, a need still remains for an integrated circuit package-in-package system providing low cost manufacturing, improved yield, improved reliability, and greater flexibility to offer more functionality and fewer footprints on the printed circuit board. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package-in-package system including: forming an integrated circuit package system including: connecting a first integrated circuit die and a lead, and forming an inner encapsulation covering the first integrated circuit die and a portion of the lead; mounting a second integrated circuit die to the integrated circuit package system; connecting the second integrated circuit die and the lead; and forming a package encapsulation covering the integrated circuit package system and the second integrated circuit die with the lead exposed.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
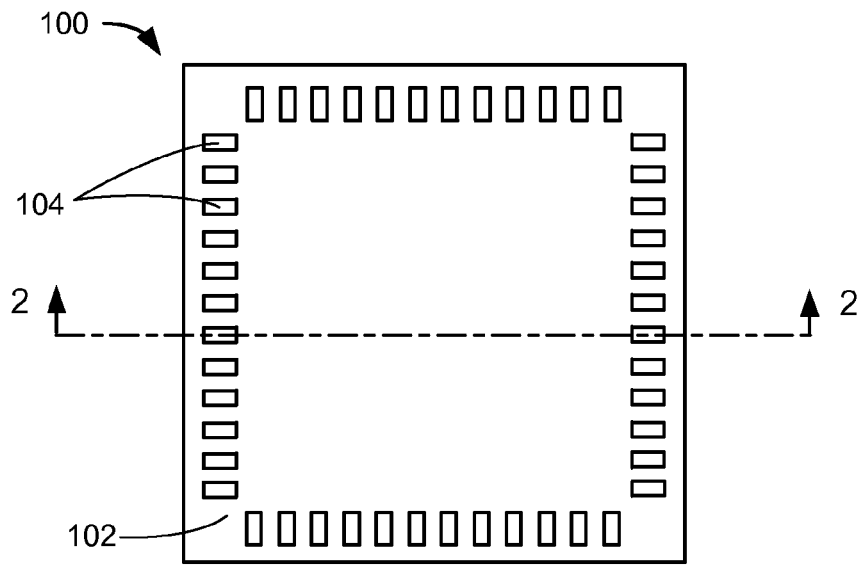
FIG. 1 is a bottom view of an integrated circuit package-in-package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a bottom view of an integrated circuit package-in-package system 100 in a first embodiment of the present invention. The bottom view shows a package encapsulation 102, such as an epoxy molding compound, preferably surrounding a single row of external interconnects 104, such as terminal pads. The external interconnects 104 are adjacent to the boundary of the package encapsulation 102, as an example.

Figure 2:
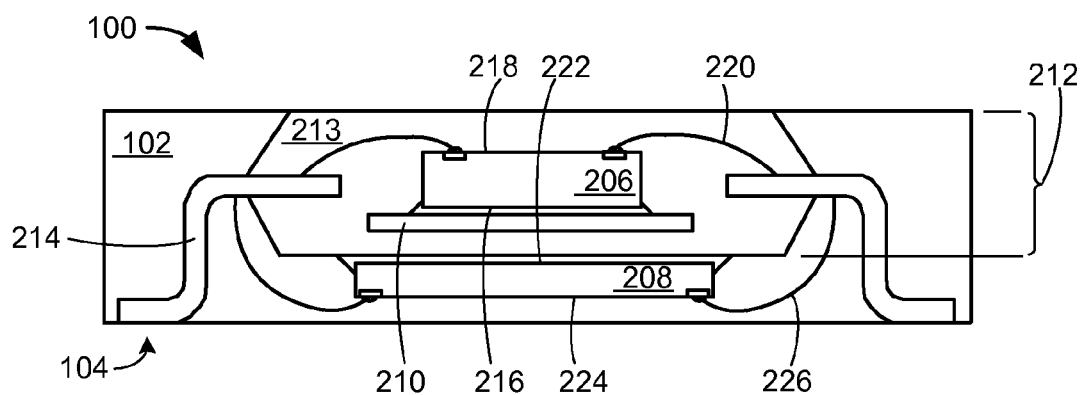
FIG. 2 is a cross-sectional view of the integrated circuit package-in-package system along line 2-2 of FIG. 1.

Referring now to FIG. 2, therein is shown a cross-sectional view of the integrated circuit package-in-package system 100 along a line 2-2 of FIG. 1. The cross-sectional view depicts a first integrated circuit die 206 and a second integrated circuit die 208 in the integrated circuit package-in-package system 100. The first integrated circuit die 206 is preferably mounted over a die-attach paddle 210 in an integrated circuit package system 212.

The integrated circuit package system 212, for example a Quad Flat Pack (QFP), includes an inner encapsulation 213, such as an epoxy molding compound, covering the first integrated circuit die 206, the die-attach paddle 210 and a first end of leads 214. The first integrated circuit die 206 includes a first non-active side 216 and a first active side 218, wherein the first active side 218 includes active circuitry fabricated thereon. First internal interconnects 220, such as bond wires, connect the first active side 218 with a predetermined selection of the leads 214 of the integrated circuit package system 212. The second end of leads 214 also serve as the external interconnects 104 of the integrated circuit package-in-package system 100.

The second integrated circuit die 208 includes a second non-active side 222 and a second active side 224, wherein the second active side 224 includes active circuitry fabricated thereon. The second non-active side 222 is preferably facing the integrated circuit package system 212. In this example, the second integrated circuit die 208 is mounted below the inner encapsulation 213. Second internal interconnects 226, such as bond wires, connect the second active side 224 with a predetermined selection of the leads 214 and is coupled beyond the limits and outside the area of the inner encapsulation 213.

It has been discovered that the present invention improves electrical performance by using the leads 214 of the integrated circuit package system 212 as the external interconnects 104 of the integrated circuit package-in-package system 100 thereby eliminating electrical discontinuity that may be found from an interface structure, such as an interposer (not shown). It has also been discovered that the present invention improves yield and lowers cost with the first integrated circuit die 206 and the second integrated circuit die 208 connecting to predetermined selections of the leads 214 without additional signal redistribution or redistribution structure (not shown), such as an interposer or printed circuit board.

In this example, the package encapsulation 102 is molded directly on the second integrated circuit die 208 and the integrated circuit package system 212 to enclose the second end of the leads 214. The external interconnects 104 are formed by a surface of the second end of the leads 214 exposed from and coplanar with the package encapsulation 102. The package encapsulation 102 partially exposes the inner encapsulation 213 over the leads 214. The leads 214 may be Nickel-Palladium (NiPd) plated, as an example.

Figure 3:
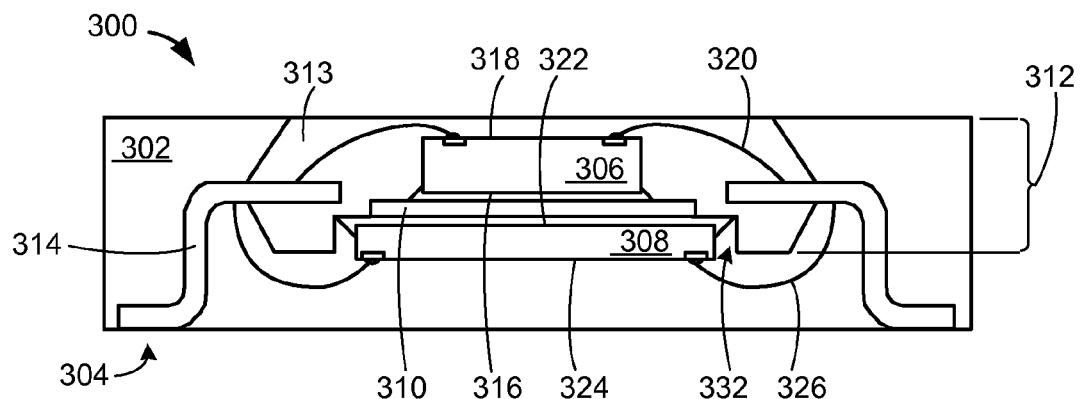
FIG. 3 is a cross-sectional view similar to FIG. 1 of an integrated circuit package-in-package system in a second embodiment of the present invention.

Referring now to FIG. 3, therein is shown a cross-sectional view similar to FIG. 1 of an integrated circuit package-in-package system 300 in a second embodiment of the present invention. The cross-sectional view depicts a first integrated circuit die 306 and a second integrated circuit die 308 in the integrated circuit package-in-package system 300. The first integrated circuit die 306 is preferably mounted over a die-attach paddle 310 in an integrated circuit package system 312.

The integrated circuit package system 312, for example, is a Quad Flat Pack (QFP) with an inner encapsulation 313 covering the first integrated circuit die 306 and a portion of leads with the die-attach paddle 310 partially exposed. The first integrated circuit die 306 includes a first non-active side 316 and a first active side 318. First internal interconnects 320, such as bond wires, connect the first active side 318 of the first integrated circuit die 306 with a predetermined selection of leads 314 of the integrated circuit package system 312. The leads 314 also serve as external interconnects 304 of the integrated circuit package-in-package system 300.

The second integrated circuit die 308 includes a second non-active side 322 and a second active side 324. The second non-active side 322 is preferably facing the integrated circuit package system 312. In this example, the second integrated circuit die 308 is mounted below the die-attach paddle 310 and within a recess 332 in the inner encapsulation 313. Second internal interconnects 326, such as bond wires, connect the second active side 324 with a predetermined selection of the leads 314.

In this example, a package encapsulation 302 covers the second integrated circuit die 308 with the external interconnects 304 of the leads 314 exposed. The package encapsulation 302 partially exposes the inner encapsulation 313 over the leads 314.

Figure 4:
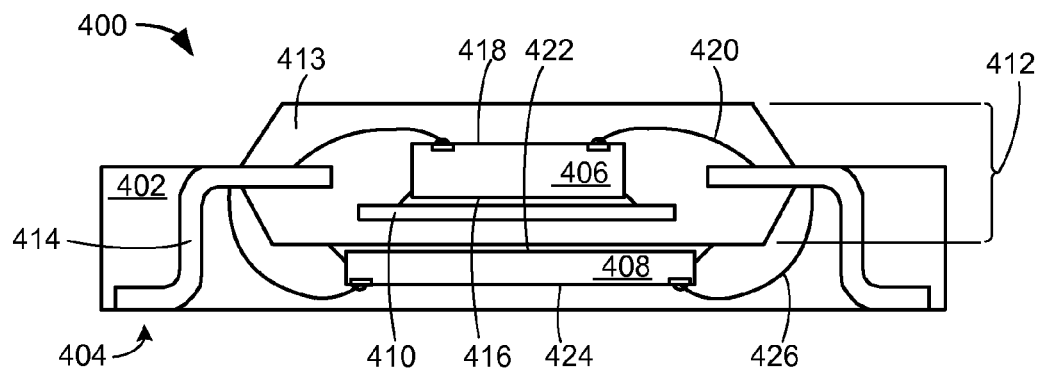
FIG. 4 is a cross-sectional view similar to FIG. 1 of an integrated circuit package-in-package system in a third embodiment of the present invention.

Referring now to FIG. 4, therein is shown a cross-sectional view similar to FIG. 1 of an integrated circuit package-in-package system 400 in a third embodiment of the present invention. The cross-sectional view depicts a first integrated circuit die 406 and a second integrated circuit die 408 in the integrated circuit package-in-package system 400. The first integrated circuit die 406 is preferably mounted over a die-attach paddle 410 in an integrated circuit package system 412.

The integrated circuit package system 412, for example, is a Quad Flat Pack (QFP) with an inner encapsulation 413 covering the first integrated circuit die 406, the die-attach paddle 410 and a portion of leads 414. The first integrated circuit die 406 includes a first non-active side 416 and a first active side 418. First internal interconnects 420, such as bond wires, connect the first active side 418 with a predetermined selection of the leads 414 of the integrated circuit package system 412. The leads 414 also serve as external interconnects 404 of the integrated circuit package-in-package system 400.

The second integrated circuit die 408 includes a second non-active side 422 and a second active side 424. The second non-active side 422 is preferably facing the integrated circuit package system 412. In this example, the second integrated circuit die 408 is mounted below the inner encapsulation 413. Second internal interconnects 426, such as bond wires, connect the second active side 424 with a predetermined selection of the leads 414.

In this example, a package encapsulation 402 covers a bottom half of the integrated circuit package system 412 and the second integrated circuit die 408 with the leads 414 partially exposed, such as the external interconnects 404 or the portion of the leads 414 extending from the inner encapsulation 413. The package encapsulation 402 exposes a top half of the inner encapsulation 413.

Figure 5:
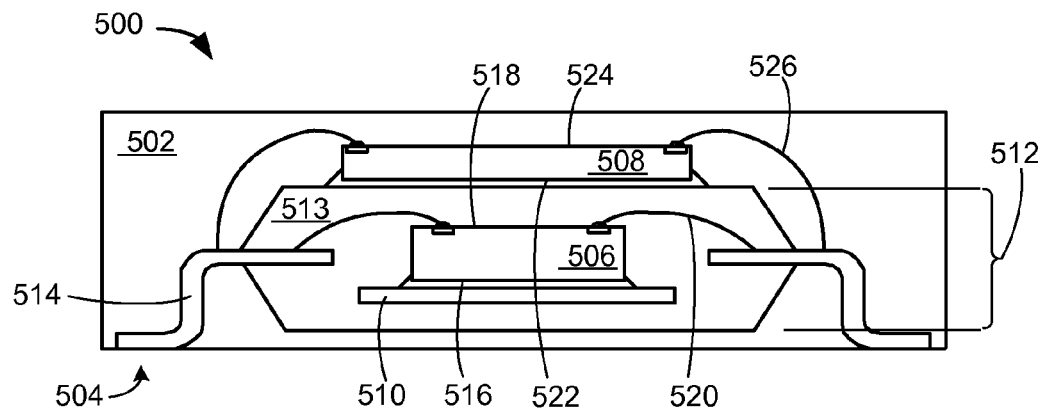
FIG. 5 is a cross-sectional view similar to FIG. 1 of an integrated circuit package-in-package system in a fourth embodiment of the present invention.

Referring now to FIG. 5, therein is shown a cross-sectional view similar to FIG. 1 of an integrated circuit package-in-package system 500 in a fourth embodiment of the present invention. The cross-sectional view depicts a first integrated circuit die 506 and a second integrated circuit die 508 in the integrated circuit package-in-package system 500. The first integrated circuit die 506 is preferably mounted over a die-attach paddle 510 in an integrated circuit package system 512.

The integrated circuit package system 512, for example, is a Quad Flat Pack (QFP) with an inner encapsulation 513 covering the first integrated circuit die 506, the die-attach paddle 510 and a portion of leads 514. The first integrated circuit die 506 includes a first non-active side 516 and a first active side 518. First internal interconnects 520, such as bond wires, connect the first active side 518 with a predetermined selection of the leads 514 of the integrated circuit package system 512. The leads 514 also serve as external interconnects 504 of the integrated circuit package-in-package system 500.

The second integrated circuit die 508 includes a second non-active side 522 and a second active side 524. The second non-active side 522 is preferably facing the integrated circuit package system 512. In this example, the second integrated circuit die 508 is mounted above the first integrated circuit die 506 and the inner encapsulation 513. Second internal interconnects 526, such as bond wires, connect the second active side 524 with a predetermined selection of the leads 514. In this example, a package encapsulation 502 covers the second integrated circuit die 508 with the external interconnects 504 of the leads 514 exposed.

Figure 6:
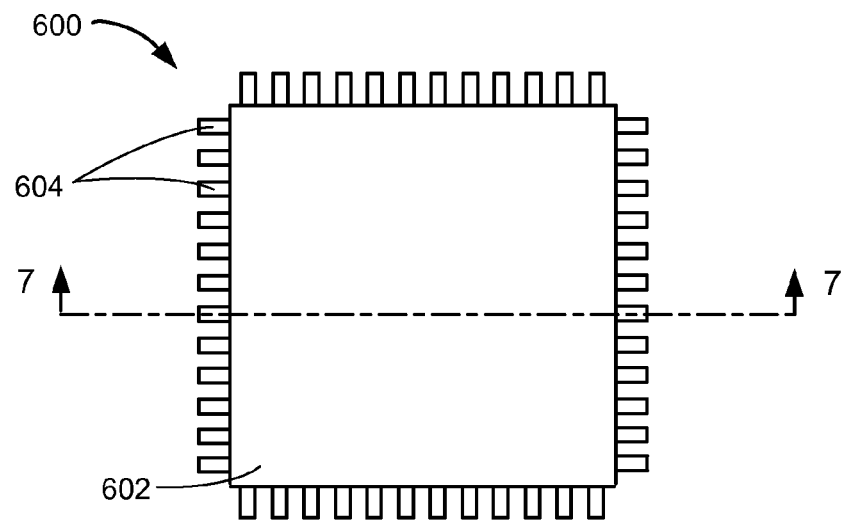
FIG. 6 is a bottom view of an integrated circuit package-in-package system in a fifth embodiment of the present invention.

Referring now to FIG. 6, therein is shown a bottom view of an integrated circuit package-in-package system 600 in a fifth embodiment of the present invention. The bottom view shows a package encapsulation 602, such as an epoxy molding compound, preferably surrounding a single row of external interconnects 604, such as terminal pads. The external interconnects 604 extend beyond the boundary of the package encapsulation 602, as an example.

Figure 7:
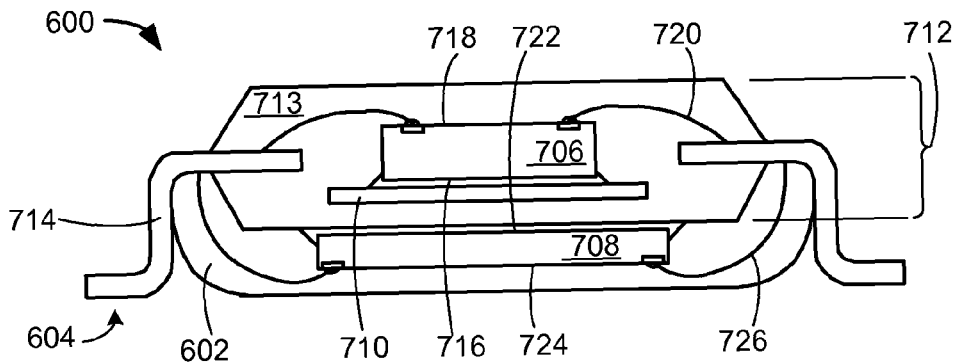
FIG. 7 is a cross-sectional view of the integrated circuit package-in-package system along line 7-7 of FIG. 6.

Referring now to FIG. 7, therein is shown a cross-sectional view of the integrated circuit package-in-package system 600 along a line 7-7 of FIG. 6. The cross-sectional view depicts a first integrated circuit die 706 and a second integrated circuit die 708 in the integrated circuit package-in-package system 600. The first integrated circuit die 706 is preferably mounted over a die-attach paddle 710 in an integrated circuit package system 712.

The integrated circuit package system 712, for example, is a Quad Flat Pack (QFP) with an inner encapsulation 713, such as an epoxy molding compound, covering the first integrated circuit die 706, the die-attach paddle 710 and a portion of leads 714. The first integrated circuit die 706 includes a first non-active side 716 and a first active side 718. First internal interconnects 720, such as bond wires, connect the first active side 718 with a predetermined selection of the leads 714 of the integrated circuit package system 712. The leads 714 serve as the external interconnects 604 of the integrated circuit package-in-package system 600.

The second integrated circuit die 708 includes a second non-active side 722 and a second active side 724. The second non-active side 722 is preferably facing the integrated circuit package system 712. In this example, the second integrated circuit die 708 is mounted the inner encapsulation 713. Second internal interconnects 726, such as bond wires, connect the second active side 724 with a predetermined selection of the leads 714.

In this example, the package encapsulation 602 covers a lower portion of the integrated circuit package system 712 and the second integrated circuit die 708 with the leads 714 partially exposed. The package encapsulation 602 exposes an upper portion of the inner encapsulation 713.

Figure 8:
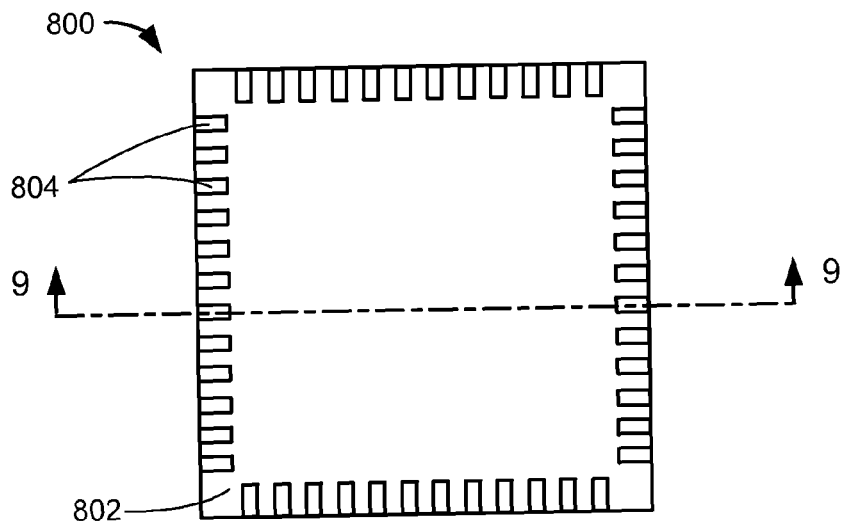
FIG. 8 is a bottom view of an integrated circuit package-in-package system in a sixth embodiment of the present invention.

Referring now to FIG. 8, therein is shown a bottom view of an integrated circuit package-in-package system 800 in a sixth embodiment of the present invention. The bottom view shows a package encapsulation 802, such as an epoxy molding compound, preferably surrounding a single row of external interconnects 804, such as terminal pads. The external interconnects 804 are along the boundary of the package encapsulation 802.

Figure 9:
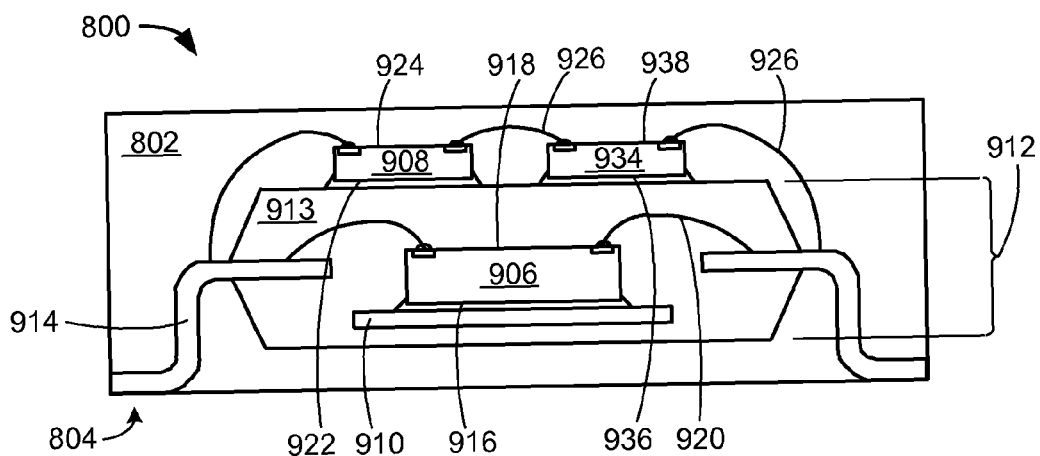
FIG. 9 is a cross-sectional view of the integrated circuit package-in-package system along line 9-9 of FIG. 8.

Referring now to FIG. 9, therein is shown a cross-sectional view of the integrated circuit package-in-package system 800 along a line 9-9 of FIG. 8. The cross-sectional view depicts a first integrated circuit die 906, a second integrated circuit die 908, and a third integrated circuit die 934 in the integrated circuit package-in-package system 800. The first integrated circuit die 906 is preferably mounted over a die-attach paddle 910 in an integrated circuit package system 912.

The integrated circuit package system 912, for example, is a Quad Flat Pack (QFP) with an inner encapsulation 913 covering the first integrated circuit die 906, the die-attach paddle 910 and a portion of leads 914. The first integrated circuit die 906 includes a first non-active side 916 and a first active side 918. First internal interconnects 920, such as bond wires, connect the first active side 918 with a predetermined selection of the leads 914 of the integrated circuit package system 912. The leads 914 also serve as the external interconnects 804 of the integrated circuit package-in-package system 800.

The second integrated circuit die 908 includes a second non-active side 922 and a second active side 924. The second non-active side 922 is preferably facing the integrated circuit package system 912. The third integrated circuit die 934 includes a third non-active side 936 and a third active side 938. The third non-active side 936 is preferably facing the integrated circuit package system 912. In this example, the second integrated circuit die 908 and the third integrated circuit die 934 are mounted over the inner encapsulation 913. Second internal interconnects 926, such as bond wires, connect the second active side 924 and the third active side 938 with a predetermined selection of the leads 914 as well as between the second active side 924 and the third active side 938.

In this example, the package encapsulation 802 covers the second integrated circuit die 908 and the third integrated circuit die 934 with the external interconnects 804 of the leads 914 exposed. The leads 914 are also exposed at the sides of the package encapsulation 802.

Figure 10:
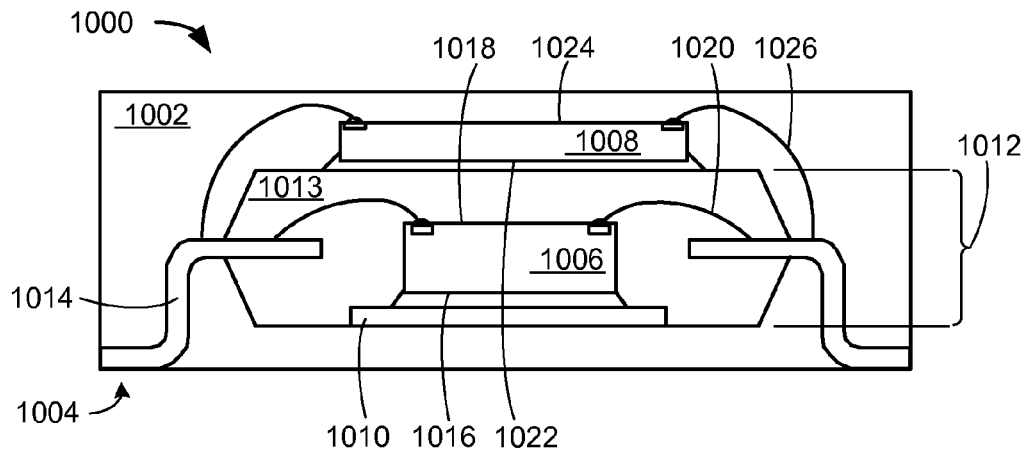
FIG. 10 is a cross-sectional view similar to FIG. 8 of an integrated circuit package-in-package system in a seventh embodiment of the present invention.

Referring now to FIG. 10, therein is shown a cross-sectional view similar to FIG. 8 of an integrated circuit package-in-package system 1000 in a seventh embodiment of the present invention. The cross-sectional view depicts a first integrated circuit die 1006 and a second integrated circuit die 1008 in the integrated circuit package-in-package system 1000. The first integrated circuit die 1006 is preferably mounted over a die-attach paddle 1010 in an integrated circuit package system 1012.

The integrated circuit package system 1012, for example, is a Quad Flat Pack (QFP) with an inner encapsulation 1013 covering the first integrated circuit die 1006 and a portion of leads 1014. The inner encapsulation 1013 partially exposes the die-attach paddle 1010. The first integrated circuit die 1006 includes a first non-active side 1016 and a first active side 1018. First internal interconnects 1020, such as bond wires, connect the first active side 1018 with a predetermined selection of the leads 1014 of the integrated circuit package system 1012. The leads 1014 also serve as external interconnects 1004 of the integrated circuit package-in-package system 1000.

The second integrated circuit die 1008 includes a second non-active side 1022 and a second active side 1024. The second non-active side 1022 is preferably facing the integrated circuit package system 1012. In this example, the second integrated circuit die 1008 is mounted over the inner encapsulation 1013. Second internal interconnects 1026, such as bond wires, connect the second active side 1024 with a predetermined selection of the leads 1014.

In this example, a package encapsulation 1002 covers the second integrated circuit die 1008 and exposes the external interconnects 1004 of the leads 1014. The leads 1014 are also exposed at the sides of the package encapsulation 1002.

Figure 11:
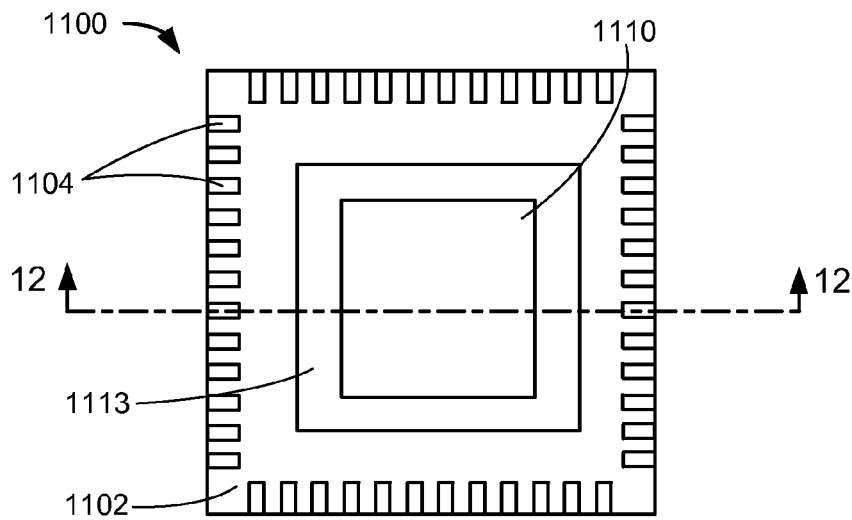
FIG. 11 is a bottom view of an integrated circuit package-in-package system in an eighth embodiment of the present invention.

Referring now to FIG. 11, therein is shown a bottom view of an integrated circuit package-in-package system 1100 in an eighth embodiment of the present invention. The bottom view shows a package encapsulation 1102, such as an epoxy molding compound, preferably surrounding a single row of external interconnects 1104, such as terminal pads. The external interconnects 1104 are adjacent to the boundary of the package encapsulation 1102, as an example. In this example, a die-attach paddle 1110 and an inner encapsulation 1113 are exposed from the package encapsulation 1102.

Figure 12:
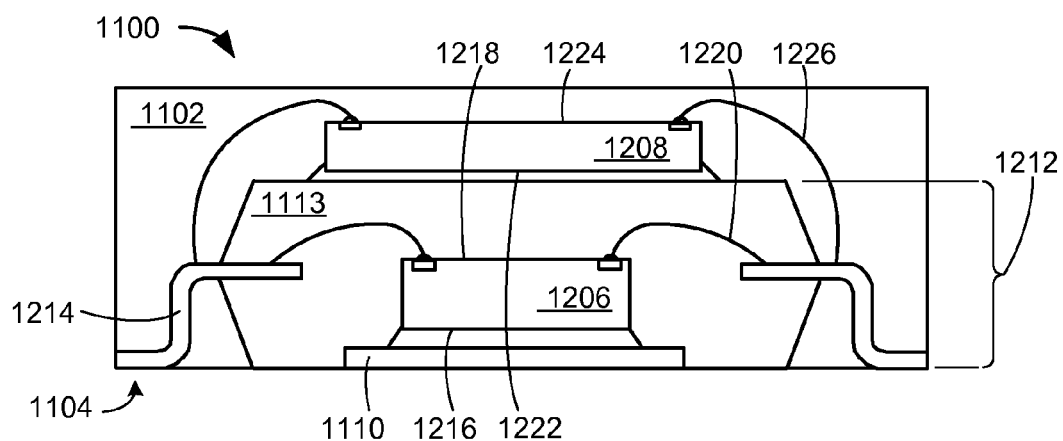
FIG. 12 is a cross-sectional view of the integrated circuit package-in-package system along line 12-12 of FIG. 1.

Referring now to FIG. 12, therein is shown a cross-sectional view of the integrated circuit package-in-package system 1100 along a line 12-12 of FIG. 11. The cross-sectional view depicts a first integrated circuit die 1206 and a second integrated circuit die 1208 in the integrated circuit package-in-package system 1100. The first integrated circuit die 1206 is preferably mounted over the die-attach paddle 1110 in an integrated circuit package system 1212.

The integrated circuit package system 1212, for example, is a Quad Flat Pack (QFP) with the inner encapsulation 1113 covering the first integrated circuit die 1206 and a portion of leads 1214. The inner encapsulation 1113 exposes the die-attach paddle 1110. The first integrated circuit die 1206 includes a first non-active side 1216 and a first active side 1218. First internal interconnects 1220, such as bond wires, connect the first active side 1218 with a predetermined selection of the leads 1214 of the integrated circuit package system 1212. The leads 1214 also serve as the external interconnects 1104 of the integrated circuit package-in-package system 1100.

The second integrated circuit die 1208 includes a second non-active side 1222 and a second active side 1224. The second non-active side 1222 is preferably facing the integrated circuit package system 1212. In this example, the second integrated circuit die 1208 is mounted over the inner encapsulation 1113. Second internal interconnects 1226, such as bond wires, connect the second active side 1224 with a predetermined selection of the leads 1214.

In this example, the package encapsulation 1102 covers the second integrated circuit die 1208 and exposes the external interconnects 1104, the die-attach paddle 1110, and the inner encapsulation 1113. The leads 1214 are also exposed at sides of the package encapsulation 1102.

Figure 13:
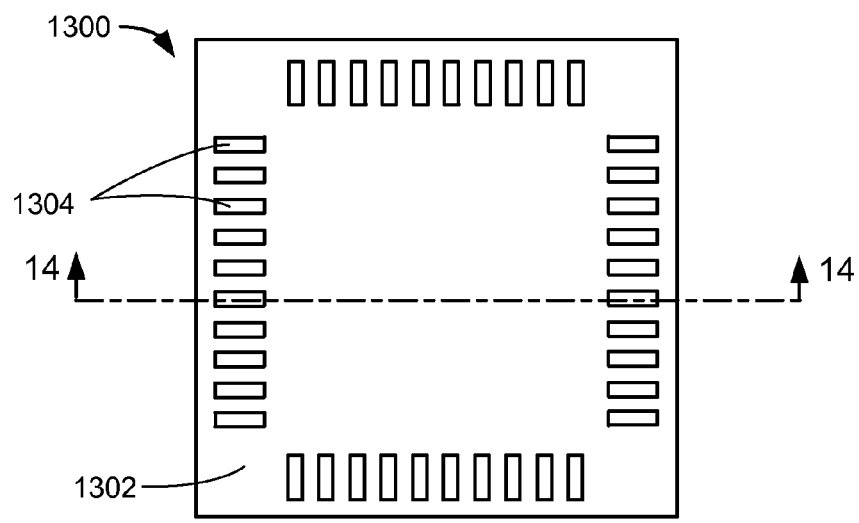
FIG. 13 is a bottom view of an integrated circuit package-in-package system in a ninth embodiment of the present invention.

Referring now to FIG. 13, therein is shown a bottom view of an integrated circuit package-in-package system 1300 in a ninth embodiment of the present invention. The bottom view shows a package encapsulation 1302, such as an epoxy molding compound, preferably surrounding a single row of external interconnects 1304, such as terminal pads. The external interconnects 1304 are adjacent to the boundary of the package encapsulation 1302.

Figure 14:
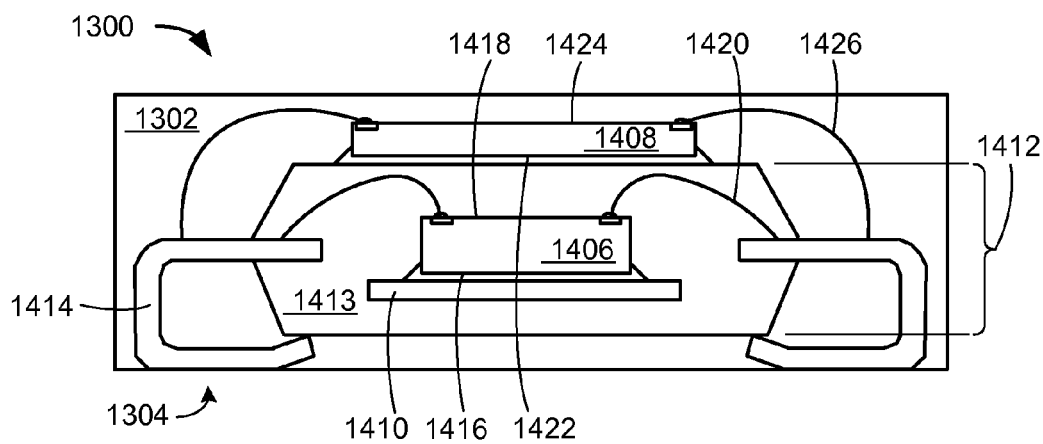
FIG. 14 is a cross-sectional view of the integrated circuit package-in-package system along line 14-14 of FIG. 13.

Referring now to FIG. 14, therein is shown a cross-sectional view of the integrated circuit package-in-package system 1300 along a line 14-14 of FIG. 13. The cross-sectional view depicts a first integrated circuit die 1406 and a second integrated circuit die 1408 in the integrated circuit package-in-package system 1300. The first integrated circuit die 1406 is preferably mounted over a die-attach paddle 1410 in an integrated circuit package system 1412.

The integrated circuit package system 1412, for example, is a Quad Flat Pack (QFP) with an inner encapsulation 1413 covering the die-attach paddle 1410, the first integrated circuit die 1406 and a portion of leads 1414. The first integrated circuit die 1406 includes a first non-active side 1416 and a first active side 1418. First internal interconnects 1420, such as bond wires, connect the first active side 1418 with a predetermined selection of the leads 1414 of the integrated circuit package system 1412. The leads 1414 also serve as the external interconnects 1304 of the integrated circuit package-in-package system 1300. In this example, the leads 1414 are in a configuration of a C-bend, wherein the leads 1414 extend from the sides of the inner encapsulation 1413 terminating under the inner encapsulation 1413.

The second integrated circuit die 1408 includes a second non-active side 1422 and a second active side 1424. The second non-active side 1422 is preferably facing the integrated circuit package system 1412. In this example, the second integrated circuit die 1408 is mounted over the inner encapsulation 1413. Second internal interconnects 1426, such as bond wires, connect the second active side 1424 with a predetermined selection of the leads 1414. In this example, the package encapsulation 1302 covers the second integrated circuit die 1408 and the integrated circuit package system 1412 with a bottom horizontal portion of the leads 1414 exposed as the external interconnects 1304.

Figure 15:
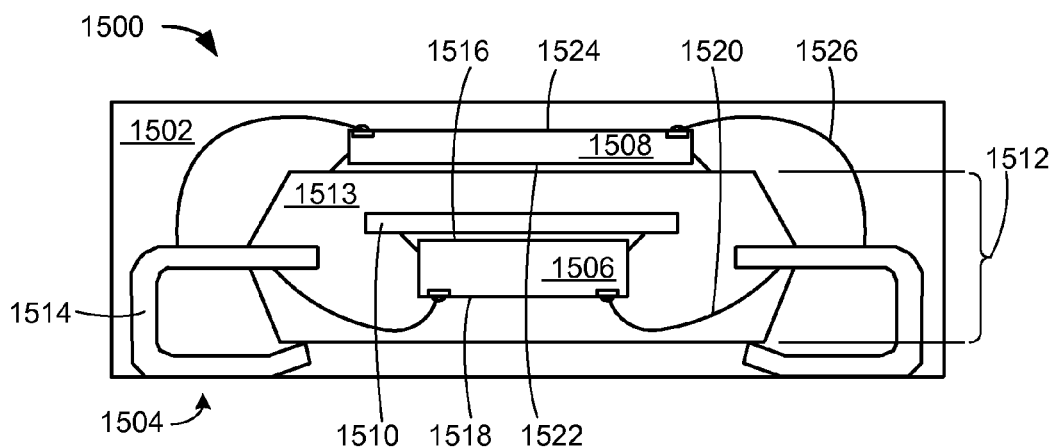
FIG. 15 is a cross-sectional view similar to FIG. 13 of an integrated circuit package-in-package system in a tenth embodiment of the present invention.

Referring now to FIG. 15, therein is shown a cross-sectional view similar to FIG. 13 of an integrated circuit package-in-package system 1500 in a tenth embodiment of the present invention. The cross-sectional view depicts a first integrated circuit die 1506 and a second integrated circuit die 1508 in the integrated circuit package-in-package system 1500. The first integrated circuit die 1506 is preferably mounted under a die-attach paddle 1510 in an integrated circuit package system 1512.

The integrated circuit package system 1512, for example, is a Quad Flat Pack (QFP) with an inner encapsulation 1513 covering the die-attach paddle 1510, the first integrated circuit die 1506 and a portion of leads 1514. The first integrated circuit die 1506 includes a first non-active side 1516 and a first active side 1518. First internal interconnects 1520, such as bond wires, connect the first active side 1518 with a predetermined selection of the leads 1514 of the integrated circuit package system 1512. The leads 1514 also serve as external interconnects 1504 of the integrated circuit package-in-package system 1500. In this example, the leads 1514 are in a configuration of a C-bend, wherein the leads 1514 extend from the sides of the inner encapsulation 1513 terminating under the inner encapsulation 1513.

The second integrated circuit die 1508 includes a second non-active side 1522 and a second active side 1524. The second non-active side 1522 is preferably facing the integrated circuit package system 1512. In this example, the second integrated circuit die 1508 is mounted over the inner encapsulation 1513. Second internal interconnects 1526, such as bond wires, connect the second active side 1524 with a predetermined selection of the leads 1514. In this example, a package encapsulation 1502 covers the second integrated circuit die 1508 and the integrated circuit package system 1512 with a bottom horizontal portion of the leads 1514 exposed as the external interconnects 1504.

Figure 16:
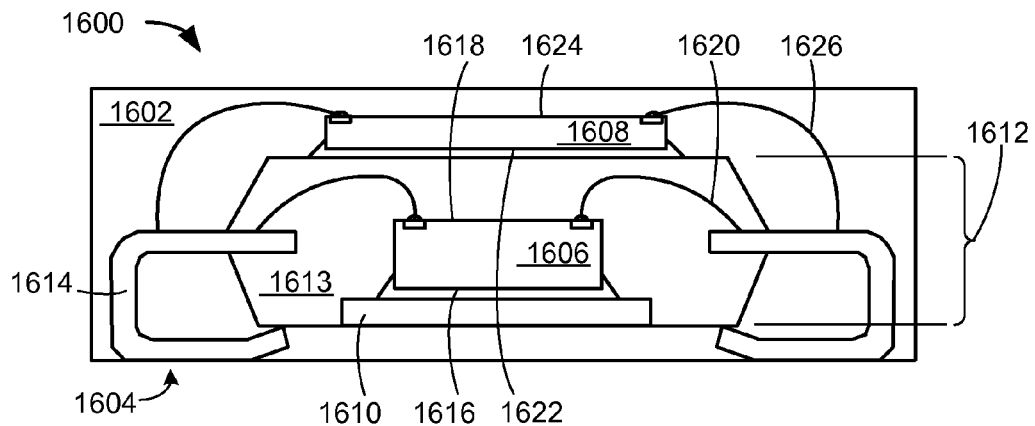
FIG. 16 is a cross-sectional view similar to FIG. 13 of an integrated circuit package-in-package system in an eleventh embodiment of the present invention.

Referring now to FIG. 16, therein is shown a cross-sectional view similar to FIG. 13 of an integrated circuit package-in-package system 1600 in an eleventh embodiment of the present invention. The cross-sectional view depicts a first integrated circuit die 1606 and a second integrated circuit die 1608 in the integrated circuit package-in-package system 1600. The first integrated circuit die 1606 is preferably mounted over a die-attach paddle 1610 in an integrated circuit package system 1612.

The integrated circuit package system 1612, for example, is a Quad Flat Pack (QFP) with an inner encapsulation 1613 covering the first integrated circuit die 1606 and a portion of leads 1614. A bottom side of the inner encapsulation 1613 exposes the die-attach paddle 1610. The first integrated circuit die 1606 includes a first non-active side 1616 and a first active side 1618. First internal interconnects 1620, such as bond wires, connect the first active side 1618 with a predetermined selection of the leads 1614 of the integrated circuit package system 1612. The leads 1614 also serve as external interconnects 1604 of the integrated circuit package-in-package system 1600. In this example, the leads 1614 are in a configuration of a C-bend, wherein the leads 1614 extend from the sides of the inner encapsulation 1613 terminating under the inner encapsulation 1613.

The second integrated circuit die 1608 includes a second non-active side 1622 and a second active side 1624. The second non-active side 1622 is preferably facing the integrated circuit package system 1612. In this example, the second integrated circuit die 1608 is mounted over the inner encapsulation 1613. Second internal interconnects 1626, such as bond wires, connect the second active side 1624 with a predetermined selection of the leads 1614. In this example, a package encapsulation 1602 covers the second integrated circuit die 1608 and the integrated circuit package system 1612 with a bottom horizontal portion of the leads 1614 exposed as the external interconnects 1604.

Figure 17:
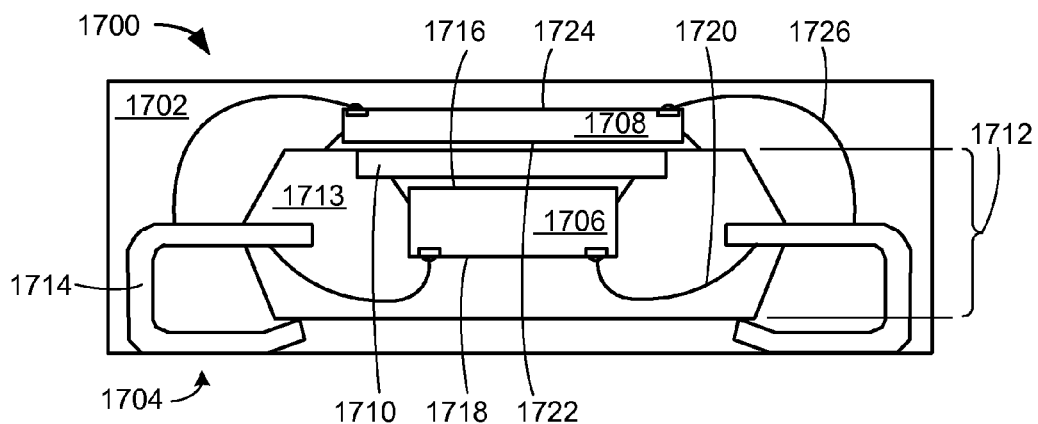
FIG. 17 is a cross-sectional view similar to FIG. 13 of an integrated circuit package-in-package system in a twelfth embodiment of the present invention.

Referring now to FIG. 17, therein is shown a cross-sectional view similar to FIG. 13 of an integrated circuit package-in-package system 1700 in a twelfth embodiment of the present invention. The cross-sectional view depicts a first integrated circuit die 1706 and a second integrated circuit die 1708 in the integrated circuit package-in-package system 1700. The first integrated circuit die 1706 is preferably mounted under a die-attach paddle 1710 in an integrated circuit package system 1712.

The integrated circuit package system 1712, for example, is a Quad Flat Pack (QFP) with an inner encapsulation 1713 covering the first integrated circuit die 1706 and a portion of leads 1714. A top side of the inner encapsulation 1713 exposes the die-attach paddle 1710. The first integrated circuit die 1706 includes a first non-active side 1716 and a first active side 1718. First internal interconnects 1720, such as bond wires, connect the first active side 1718 with a predetermined selection of the leads 1714 of the integrated circuit package system 1712. The leads 1714 also serve as external interconnects 1704 of the integrated circuit package-in-package system 1700. In this example, the leads 1714 are in a configuration of a C-bend, wherein the leads 1714 extend from the sides of the inner encapsulation 1713 terminating under the inner encapsulation 1713.

The second integrated circuit die 1708 includes a second non-active side 1722 and a second active side 1724. The second non-active side 1722 is preferably facing the integrated circuit package system 1712. In this example, the second integrated circuit die 1708 is mounted over the inner encapsulation 1713 and the die-attach paddle 1710. Second internal interconnects 1726, such as bond wires, connect the second active side 1724 with a predetermined selection of the leads 1714. In this example, a package encapsulation 1702 covers the second integrated circuit die 1708 and the integrated circuit package system 1712 with a bottom horizontal portion of the leads 1714 exposed as the external interconnects 1704.

Figure 18:
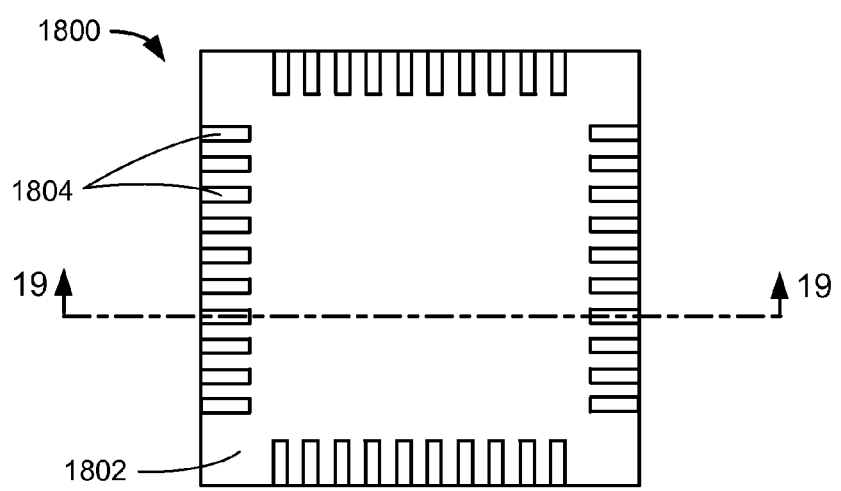
FIG. 18 is a bottom view of an integrated circuit package-in-package system in a thirteenth embodiment of the present invention.

Referring now to FIG. 18, therein is shown a bottom view of an integrated circuit package-in-package system 1800 in a thirteenth embodiment of the present invention. The bottom view shows a package encapsulation 1802, such as an epoxy molding compound, preferably surrounding a single row of external interconnects 1804, such as terminal pads. The external interconnects 1804 are along the boundary of the package encapsulation 1802.

Figure 19:
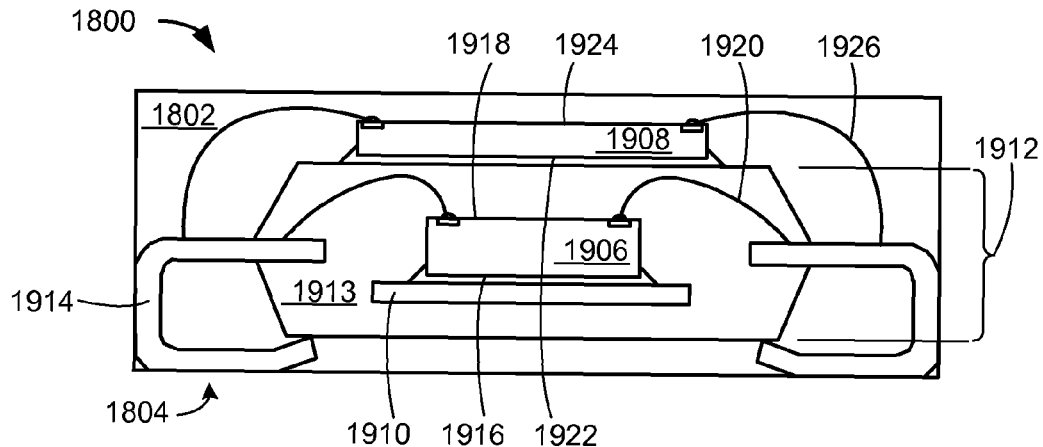
FIG. 19 is a cross-sectional view of the integrated circuit package-in-package system along line 19-19 of FIG. 18.

Referring now to FIG. 19, therein is shown a cross-sectional view of the integrated circuit package-in-package system 1800 along a line 19-19 of FIG. 18. The cross-sectional view depicts a first integrated circuit die 1906 and a second integrated circuit die 1908 in the integrated circuit package-in-package system 1800. The first integrated circuit die 1906 is preferably mounted over a die-attach paddle 1910 in an integrated circuit package system 1912.

The integrated circuit package system 1912, for example, is a Quad Flat Pack (QFP) with an inner encapsulation 1913 covering the die-attach paddle 1910, the first integrated circuit die 1906, and a portion of leads 1914. The first integrated circuit die 1906 includes a first non-active side 1916 and a first active side 1918. First internal interconnects 1920, such as bond wires, connect the first active side 1918 with a predetermined selection of the leads 1914 of the integrated circuit package system 1912. The leads 1914 also serve as the external interconnects 1804 of the integrated circuit package-in-package system 1800. In this example, the leads 1914 are in a configuration of a C-bend, wherein the leads 1914 extend from the sides of the inner encapsulation 1913 terminating under the inner encapsulation 1913.

The second integrated circuit die 1908 includes a second non-active side 1922 and a second active side 1924. The second non-active side 1922 is preferably facing the integrated circuit package system 1912. In this example, the second integrated circuit die 1908 is mounted above the inner encapsulation 1913. Second internal interconnects 1926, such as bond wires, connect the second active side 1924 with a predetermined selection of the leads 1914.

In this example, the package encapsulation 1802 covers the second integrated circuit die 1908 and the integrated circuit package system 1912 with both a bottom horizontal portion and a vertical portion of the leads 1914. The bottom horizontal portion is exposed as the external interconnects 1804.

Figure 20:
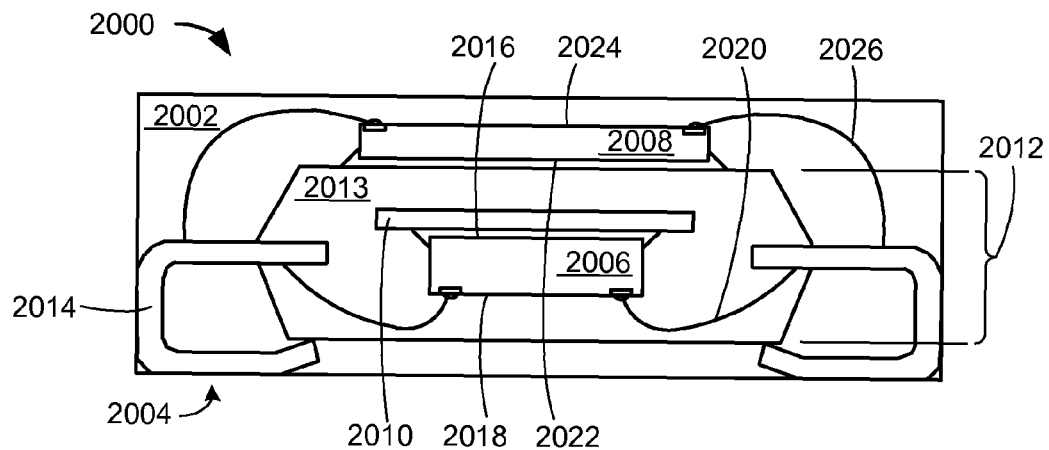
FIG. 20 is a cross-sectional view similar to FIG. 18 of an integrated circuit package-in-package system in a fourteenth embodiment of the present invention.

Referring now to FIG. 20, therein is shown a cross-sectional view similar to FIG. 18 of an integrated circuit package-in-package system 2000 in a fourteenth embodiment of the present invention. The cross-sectional view depicts a first integrated circuit die 2006 and a second integrated circuit die 2008 in the integrated circuit package-in-package system 2000. The first integrated circuit die 2006 is preferably mounted below a die-attach paddle 2010 in an integrated circuit package system 2012.

The integrated circuit package system 2012, for example, is a Quad Flat Pack (QFP) with an inner encapsulation 2013 covering the die-attach paddle 2010, the first integrated circuit die 2006 and a portion of leads 2014. The first integrated circuit die 2006 has a first non-active side 2016 and a first active side 2018. First internal interconnects 2020, such as bond wires, connect the first active side 2018 of the first integrated circuit die 2006 with a predetermined selection of the leads 2014 of the integrated circuit package system 2012. The leads 2014 also serve as external interconnects 2004 of the integrated circuit package-in-package system 2000. In this example, the leads 2014 are in a configuration of a C-bend, wherein the leads 2014 extend from the sides of the inner encapsulation 2013 terminating under the inner encapsulation 2013.

The second integrated circuit die 2008 includes a second non-active side 2022 and a second active side 2024. The second non-active side 2022 is preferably facing the integrated circuit package system 2012. In this example, the second integrated circuit die 2008 is mounted over the inner encapsulation 2013. Second internal interconnects 2026, such as bond wires, connect the second active side 2024 with a predetermined selection of the leads 2014.

In this example, a package encapsulation 2002 covers the second integrated circuit die 2008 and the integrated circuit package system 2012 with both a bottom horizontal portion and a vertical portion of the leads 2014. The bottom horizontal portion is exposed as the external interconnects 2004.

Figure 21:
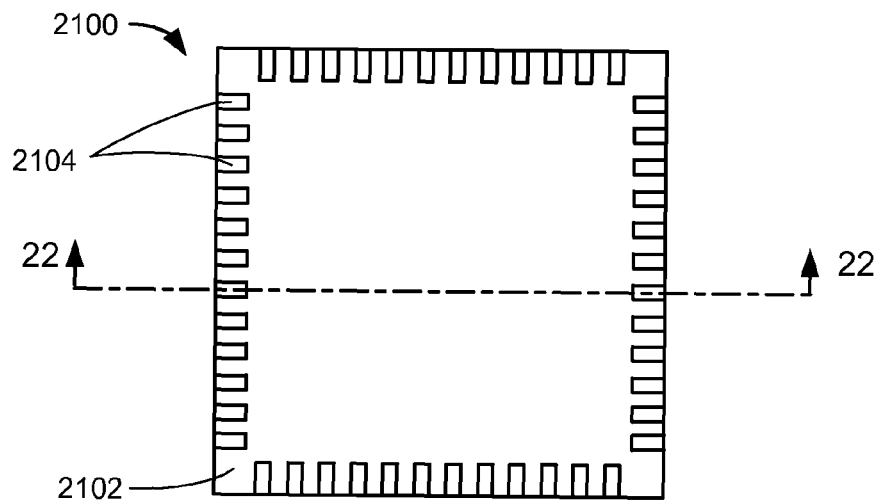
FIG. 21 is a bottom view of an integrated circuit package-in-package system in a fifteenth embodiment of the present invention.

Referring now to FIG. 21, therein is shown a bottom view of an integrated circuit package-in-package system 2100 in a fifteenth embodiment of the present invention. The bottom view shows a package encapsulation 2102, such as an epoxy molding compound, preferably surrounding a single row of external interconnects 2104, such as terminal pads. The external interconnects 2104 are along the boundary of the package encapsulation 2102.

Figure 22:
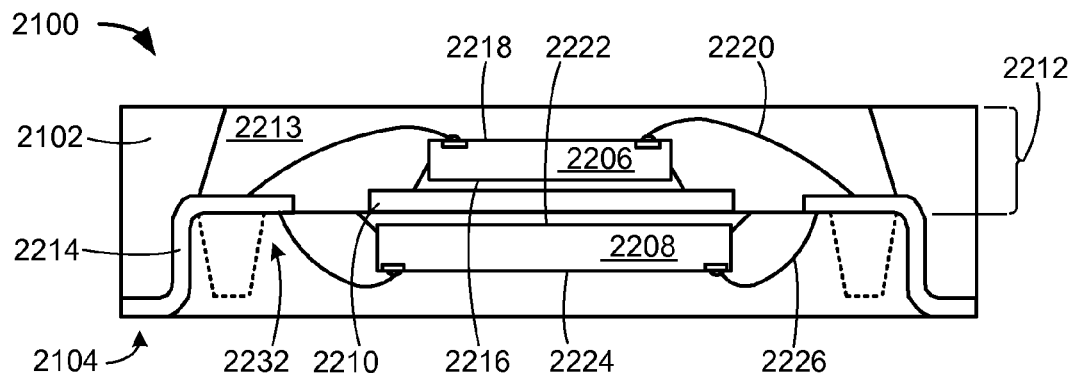
FIG. 22 is a cross-sectional view of the integrated circuit package-in-package system along line 22-22 of FIG. 21.

Referring now to FIG. 22, therein is shown a cross-sectional view of the integrated circuit package-in-package system 2100 along a line 22-22 of FIG. 21. The cross-sectional view depicts a first integrated circuit die 2206 and a second integrated circuit die 2208 in the integrated circuit package-in-package system 2100. The first integrated circuit die 2206 is preferably mounted over a die-attach paddle 2210 in an integrated circuit package system 2212.

The integrated circuit package system 2212, for example, is a Quad Flat Pack (QFP) with an inner encapsulation 2213 covering the first integrated circuit die 2206 and a portion of leads 2214. The inner encapsulation 2213 exposes the die-attach paddle 2210 and the portion of the leads 2214 coplanar with exposed portion of the die-attach paddle 2210. The first integrated circuit die 2206 includes a first non-active side 2216 and a first active side 2218. First internal interconnects 2220, such as bond wires, connect the first active side 2218 of the first integrated circuit die 2206 with a predetermined selection of the leads 2214 of the integrated circuit package system 2212. The leads 2214 also serve as the external interconnects 2104 of the integrated circuit package-in-package system 2100.

The second integrated circuit die 2208 includes a second non-active side 2222 and a second active side 2224. The second non-active side 2222 is preferably facing the integrated circuit package system 2212. In this example, the second integrated circuit die 2208 is mounted below the die-attach paddle 2210 and the inner encapsulation 2213. Second internal interconnects 2226, such as bond wires, connect the second active side 2224 with a predetermined selection of the leads 2214.

For illustrative purposes, the integrated circuit package system 2212 is shown with the second integrated circuit die 2208 as a wire bonded integrated circuit, although it is understood that the integrated circuit package system 2212 may have other types of integrated circuits. For example, the second integrated circuit die 2208 may be a flip chip with the second active side 2224 facing the die-attach paddle 2210.

In another example, a portion of the inner encapsulation 2213, shown with dotted lines, may form a recess 2232, wherein the portion of the inner encapsulation 2213 adjacent to the recess 2232 surrounds the second integrated circuit die 2208. The inner encapsulation 2213 adjacent to the recess 2232 provides additional support to the leads 2214 mitigating or eliminating damage or cracking of the integrated circuit package system 2212.

In this example, the package encapsulation 2102 of the integrated circuit package-in-package system 2100 covers the second integrated circuit die 2208 with the external interconnects 2104 of the leads 2214 exposed. Sides of the package encapsulation 2102 also expose the leads 2214. The package encapsulation 2102 partially exposes the inner encapsulation 2213.

Figure 23:
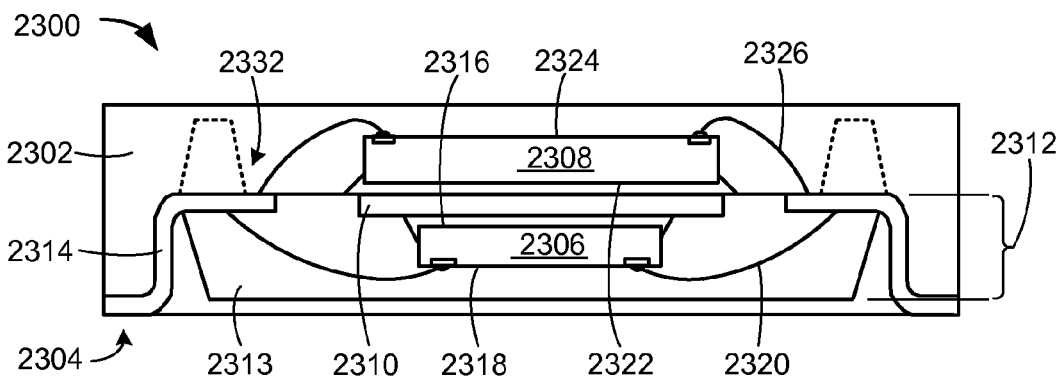
FIG. 23 is a cross-sectional view similar to FIG. 21 of an integrated circuit package-in-package system in a sixteenth embodiment of the present invention.

Referring now to FIG. 23, therein is shown a cross-sectional view similar to 21 of an integrated circuit package-in-package system 2300 in a sixteenth embodiment of the present invention. The cross-sectional view depicts a first integrated circuit die 2306 and a second integrated circuit die 2308 in the integrated circuit package-in-package system 2300. The first integrated circuit die 2306 is preferably mounted under a die-attach paddle 2310 in an integrated circuit package system 2312.

The integrated circuit package system 2312, for example, is a Quad Flat Pack (QFP) with an inner encapsulation 2313 covering the first integrated circuit die 2306 and a portion of leads 2314. The inner encapsulation 2313 exposes the die-attach paddle 2310 and the portion of the leads 2314 coplanar with the exposed portion of the die-attach paddle 2310. The first integrated circuit die 2306 has a first non-active side 2316 and a first active side 2318. First internal interconnects 2320, such as bond wires, connect the first active side 2318 of the first integrated circuit die 2306 with a predetermined selection of the leads 2314 of the integrated circuit package system 2312. The leads 2314 also serve as external interconnects 2304 of the integrated circuit package-in-package system 2300.

The second integrated circuit die 2308 includes a second non-active side 2322 and a second active side 2324. The second non-active side 2322 is preferably facing the integrated circuit package system 2312. In this example, the second integrated circuit die 2308 is mounted above the die-attach paddle 2310 and the inner encapsulation 2313. Second internal interconnects 2326, such as bond wires, connect the second active side 2324 with a predetermined selection of the leads 2314.

For illustrative purposes, the integrated circuit package system 2312 is shown with the second integrated circuit die 2308 as a wire bonded integrated circuit, although it is understood that the integrated circuit package system 2312 may have other types of integrated circuits. For example, the second integrated circuit die 2308 may be a flip chip with the second active side 2324 facing the die-attach paddle 2310.

In another example, a portion of the inner encapsulation 2313, shown with dotted lines, may form a recess 2332, wherein the portion of the inner encapsulation 2313 adjacent to the recess 2332 surrounds the second integrated circuit die 2308. The inner encapsulation 2313 adjacent to the recess 2332 provides additional support to the leads 2314 mitigating or eliminating damage or cracking of the integrated circuit package system 2312.

In this example, a package encapsulation 2302 of the integrated circuit package-in-package system 2300 covers the second integrated circuit die 2308 with the external interconnects 2304 of the leads 2314 exposed. Sides of the package encapsulation 2302 also expose the leads 2314. The package encapsulation 2302 partially exposes the inner encapsulation 2313.

Figure 24:
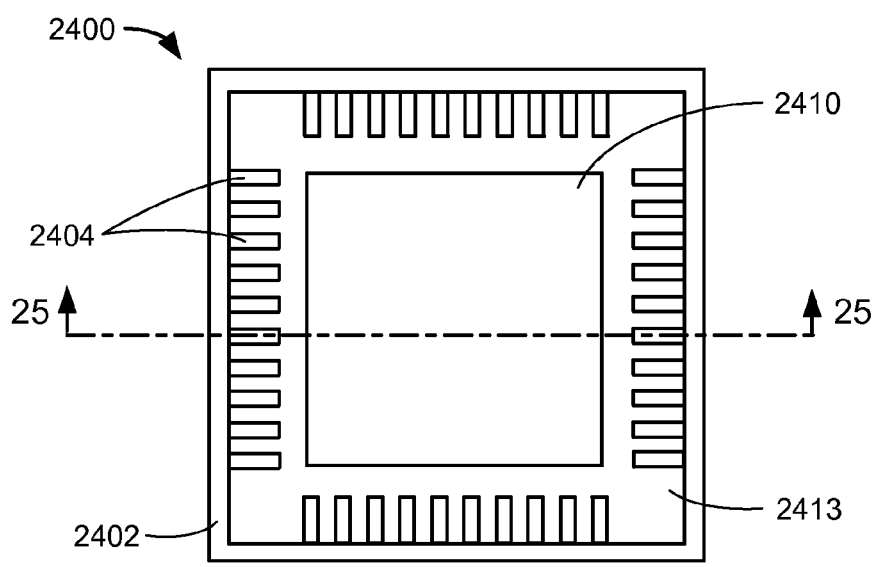
FIG. 24 is a bottom view of an integrated circuit package-in-package system in a seventeenth embodiment of the present invention.

Referring now to FIG. 24, therein is shown a bottom view of an integrated circuit package-in-package system 2400 in a seventeenth embodiment of the present invention. The bottom view shows a package encapsulation 2402, such as an epoxy molding compound, preferably surrounding a single row of external interconnects 2404, such as terminal pads. The external interconnects 2404 are along the boundary of an inner encapsulation 2413, wherein the inner encapsulation 2413 is within the package encapsulation 2402. In this example, the package encapsulation 2402 and the inner encapsulation 2413 expose a die-attach paddle 2410.

Figure 25:
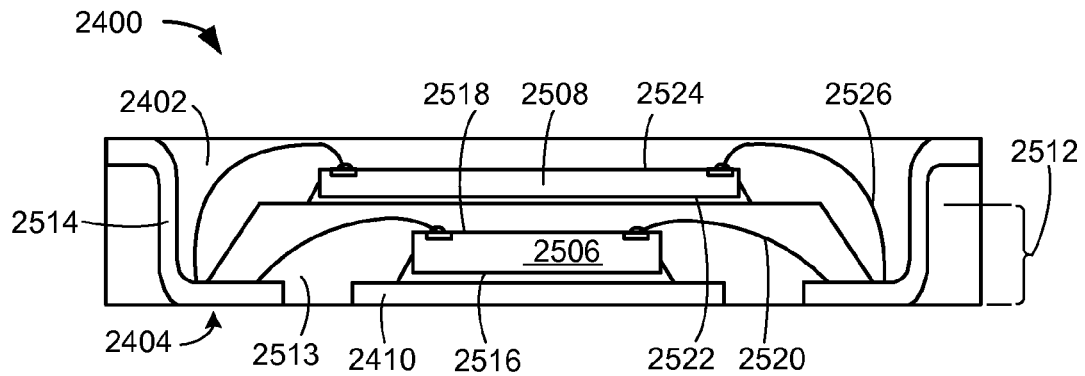
FIG. 25 is a cross-sectional view of the integrated circuit package-in-package system along line 25-25 of FIG. 24.

Referring now to FIG. 25, therein is shown a cross-sectional view of the integrated circuit package-in-package system 2400 along a line 25-25 of FIG. 24. The cross-sectional view depicts a first integrated circuit die 2506 and a second integrated circuit die 2508 in the integrated circuit package-in-package system 2400. The first integrated circuit die 2506 is preferably mounted over the die-attach paddle 2410 in an integrated circuit package system 2512.

The integrated circuit package system 2512, for example, is a Quad Flat Pack (QFP) with the inner encapsulation 2413 covering the first integrated circuit die 2506 and a portion of leads 2514. The inner encapsulation 2413 exposes the die-attach paddle 2410. The first integrated circuit die 2506 includes a first non-active side 2516 and a first active side 2518. First internal interconnects 2520, such as bond wires, connect the first active side 2518 with a predetermined selection of the leads 2514 of the integrated circuit package system 2512. The leads 2514 also serve as the external interconnects 2404 of the integrated circuit package-in-package system 2400.

The second integrated circuit die 2508 includes a second non-active side 2522 and a second active side 2524. The second non-active side 2522 is preferably facing the integrated circuit package system 2512. In this example, the second integrated circuit die 2508 is mounted over the inner encapsulation 2413. Second internal interconnects 2526, such as bond wires, connect the second active side 2524 with a predetermined selection of the leads 2514.

In this example, the package encapsulation 2402 covers the second integrated circuit die 2508 and a vertical portion of the leads 2514. Both a bottom horizontal portion and a top horizontal portion of the leads 2514 are exposed from the package encapsulation 2402. The package encapsulation 2402 also exposes the die-attach paddle 2410 and the inner encapsulation 2413. The bottom horizontal portion of the leads 2514 and the exposed portion of the die-attach paddle 2410 are coplanar.

Figure 26:
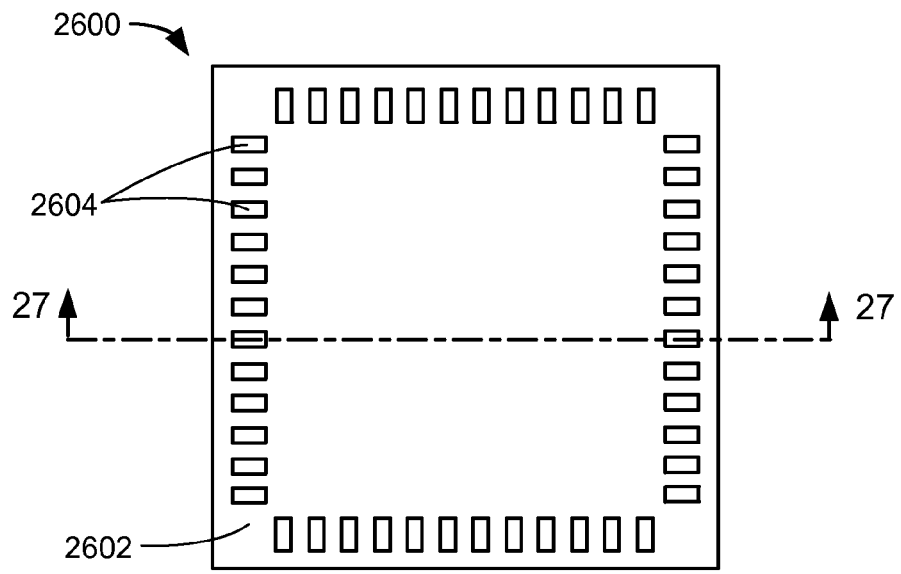
FIG. 26 is a bottom view of an integrated circuit package-in-package system in an eighteenth embodiment of the present invention.

Referring now to FIG. 26, therein is shown a bottom view of an integrated circuit package-in-package system 2600 in an eighteenth embodiment of the present invention. The bottom view shows a package encapsulation 2602, such as an epoxy molding compound, preferably surrounding a single row of external interconnects 2604, such as terminal pads. The external interconnects 2604 are adjacent to the boundary of the package encapsulation 2602.

Figure 27:
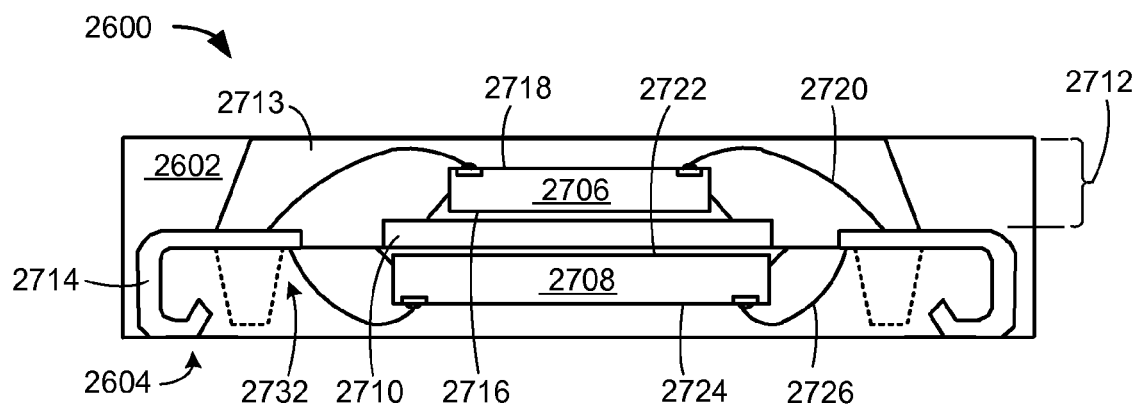
FIG. 27 is a cross-sectional view of the integrated circuit package-in-package system along line 27-27 of FIG. 26.

Referring now to FIG. 27, therein is shown a cross-sectional view of the integrated circuit package-in-package system 2600 along a line 27-27 of FIG. 26. The cross-sectional view depicts a first integrated circuit die 2706 and a second integrated circuit die 2708 in the integrated circuit package-in-package system 2600. The first integrated circuit die 2706 is preferably mounted over a die-attach paddle 2710 in an integrated circuit package system 2712.

The integrated circuit package system 2712, for example, is a Quad Flat Pack (QFP) with an inner encapsulation 2713 covering the first integrated circuit die 2706 and a portion of leads 2714. The inner encapsulation 2713 exposes the die-attach paddle 2710 and the portion of the leads 2714 coplanar with the exposed portion of the die-attach paddle 2710. The first integrated circuit die 2706 includes a first non-active side 2716 and a first active side 2718. First internal interconnects 2720, such as bond wires, connect the first active side 2718 of the first integrated circuit die 2706 with a predetermined selection of the leads 2714. The leads 2714 also serve as the external interconnects 2604 of the integrated circuit package-in-package system 2600. In this example, the leads 2714 are in a configuration of a C-bend, wherein the leads 2714 extend from the sides of the inner encapsulation 2713 terminating below the inner encapsulation 2713.

The second integrated circuit die 2708 includes a second non-active side 2722 and a second active side 2724. The second non-active side 2722 is preferably facing the integrated circuit package system 2712. In this example, the second integrated circuit die 2708 is mounted below the die-attach paddle 2710 and the inner encapsulation 2713. Second internal interconnects 2726, such as bond wires, connect the second active side 2724 with a predetermined selection of the leads 2714.

For illustrative purposes, the integrated circuit package system 2712 is shown with the second integrated circuit die 2708 as a wire bonded integrated circuit, although it is understood that the integrated circuit package system 2712 may have other types of integrated circuits. For example, the second integrated circuit die 2708 may be a flip chip with the second active side 2724 facing the die-attach paddle 2710.

In another example, a portion of the inner encapsulation 2713, shown with dotted lines, may form a recess 2732, wherein the portion of the inner encapsulation 2713 adjacent to the recess 2732 surrounds the second integrated circuit die 2708. The inner encapsulation 2713 adjacent to the recess 2732 provides additional support to the leads 2714 mitigating or eliminating damage or cracking of the integrated circuit package system 2712.

In this example, the package encapsulation 2602 covers the second integrated circuit die 2708 with a bottom horizontal portion of the leads 2714 exposed as the external interconnects 2604. A top side of the package encapsulation 2602 partially exposes the inner encapsulation 2713.

Figure 28:
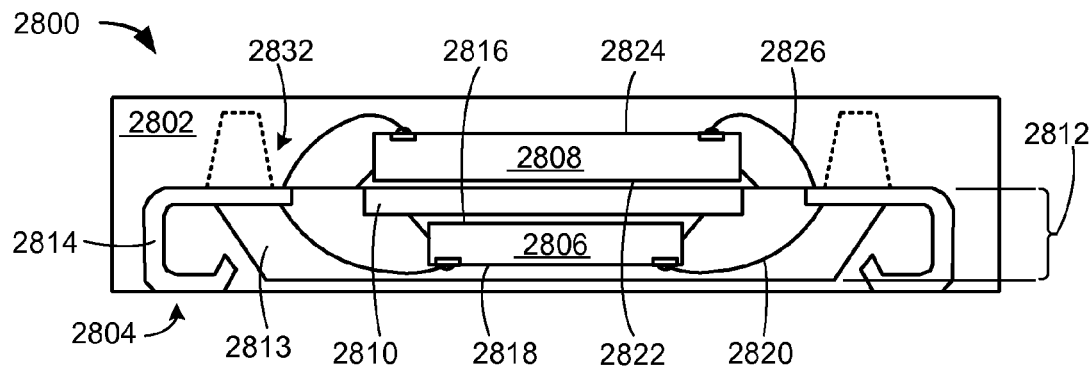
FIG. 28 is a cross-sectional view similar to FIG. 26 of an integrated circuit package-in-package system in a nineteenth embodiment of the present invention.

Referring now to FIG. 28, therein is shown a cross-sectional view similar to FIG. 26 of an integrated circuit package-in-package system 2800 in a nineteenth embodiment of the present invention. The cross-sectional view depicts a first integrated circuit die 2806 and a second integrated circuit die 2808 in the integrated circuit package-in-package system 2800. The first integrated circuit die 2806 is preferably mounted under a die-attach paddle 2810 in an integrated circuit package system 2812.

The integrated circuit package system 2812, for example, is a Quad Flat Pack (QFP) with an inner encapsulation 2813 covering the first integrated circuit die 2806 and a portion of leads 2814. The inner encapsulation 2813 exposes the die-attach paddle 2810 and the portion of the leads 2814 coplanar with the exposed portion of the die-attach paddle 2810. The first integrated circuit die 2806 includes a first non-active side 2816 and a first active side 2818. First internal interconnects 2820, such as bond wires, connect the first active side 2818 of the first integrated circuit die 2806 with a predetermined selection of the leads 2814. The leads 2814 serve as external interconnects 2804 of the integrated circuit package-in-package system 2800. In this example, the leads 2814 are in a configuration of a C-bend, wherein the leads 2814 extend from the sides of the inner encapsulation 2813 terminating below the inner encapsulation 2813.

The second integrated circuit die 2808 includes a second non-active side 2822 and a second active side 2824. The second non-active side 2822 is preferably facing the integrated circuit package system 2812. In this example, the second integrated circuit die 2808 is mounted over the die-attach paddle 2810 and the inner encapsulation 2813. Second internal interconnects 2826, such as bond wires, connect the second active side 2824 with a predetermined selection of the leads 2814. In this example, a package encapsulation 2802 covers the second integrated circuit die 2808 with a bottom horizontal portion of the leads 2814 exposed.

For illustrative purposes, the integrated circuit package system 2812 is shown with the second integrated circuit die 2808 as a wire bonded integrated circuit, although it is understood that the integrated circuit package system 2812 may have other types of integrated circuits. For example, the second integrated circuit die 2808 may be a flip chip with the second active side 2824 facing the die-attach paddle 2810.

In another example, a portion of the inner encapsulation 2813, shown with dotted lines, may form a recess 2832, wherein the portion of the inner encapsulation 2813 adjacent to the recess 2832 surrounds the second integrated circuit die

2808. The inner encapsulation 2813 adjacent to the recess 2832 provides additional support to the leads 2814 mitigating or eliminating damage or cracking of the integrated circuit package system 2812.

Figure 29:
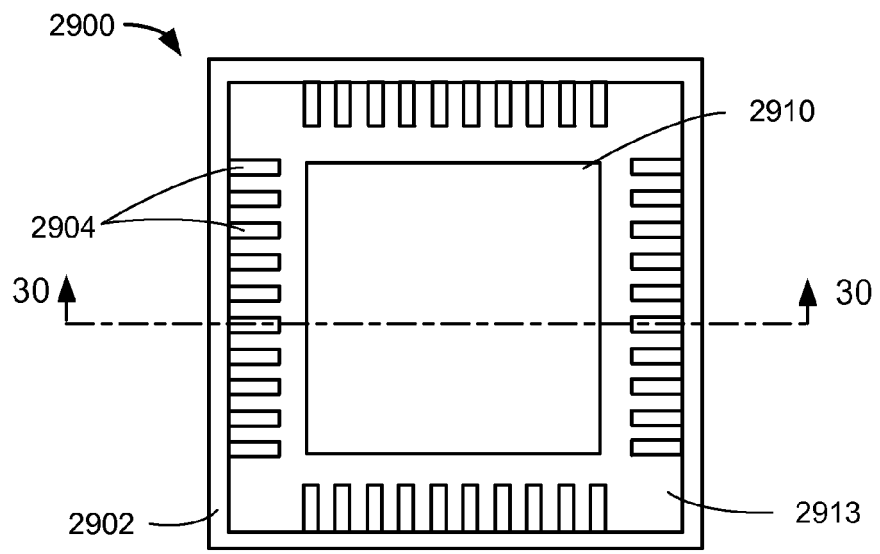
FIG. 29 is a bottom view of an integrated circuit package-in-package system in a twentieth embodiment of the present invention.

Referring now to FIG. 29, therein is shown a bottom view of an integrated circuit package-in-package system 2900 in a twentieth embodiment of the present invention. The bottom view shows a package encapsulation 2902, such as an epoxy molding compound, preferably surrounding a single row of external interconnects 2904, such as terminal pads. The external interconnects 2904 are along the boundary of an inner encapsulation 2913, wherein the inner encapsulation 2913 is within the package encapsulation 2902. In this example, the package encapsulation 2902 and the inner encapsulation 2913 expose a die-attach paddle 2910.

Figure 30:
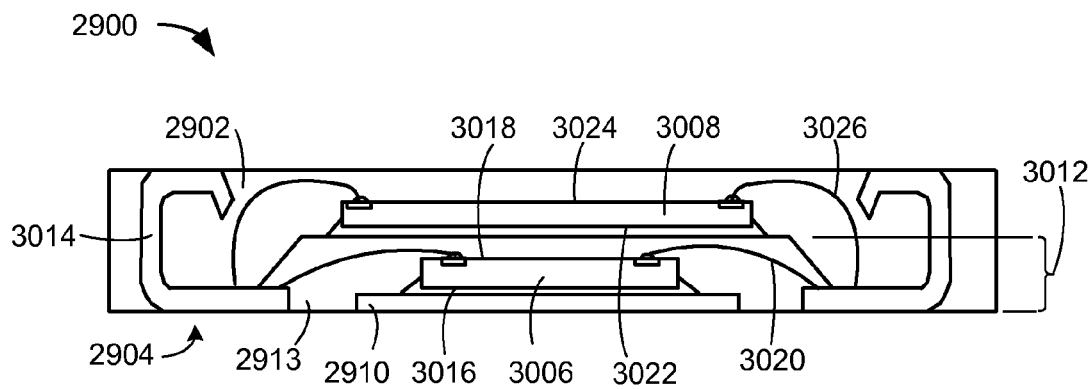
FIG. 30 is a cross-sectional view of the integrated circuit package-in-package system along line 30-30 of FIG. 29.

Referring now to FIG. 30, therein is shown a cross-sectional view of the integrated circuit package-in-package system 2900 along a line 30-30 of FIG. 29. The cross-sectional view depicts a first integrated circuit die 3006 and a second integrated circuit die 3008 in the integrated circuit package-in-package system 2900. The first integrated circuit die 3006 is preferably mounted over the die-attach paddle 2910 in an integrated circuit package system 3012.

The integrated circuit package system 3012, for example, is a Quad Flat Pack (QFP) with the inner encapsulation 2913 covering the first integrated circuit die 3006 and a portion of leads 3014. The inner encapsulation 2913 exposes the die-attach paddle 2910. The first integrated circuit die 3006 includes a first non-active side 3016 and a first active side 3018. First internal interconnects 3020, such as bond wires, connect the first active side 3018 of the first integrated circuit die 3006 with a predetermined selection of the leads 3014 of the integrated circuit package system 3012. The leads 3014 also serve as the external interconnects 2904 of the integrated circuit package-in-package system 3000. In this example, the leads 3014 are in a configuration of a C-bend, wherein the leads 3014 extend from the sides of the inner encapsulation 2913 terminating over the inner encapsulation 2913.

The second integrated circuit die 3008 includes a second non-active side 3022 and a second active side 3024. The second non-active side 3022 is preferably facing the integrated circuit package system 3012. In this example, the second integrated circuit die 3008 is mounted over the inner encapsulation 2913. Second internal interconnects 3026, such as bond wires, connect the second active side 3024 with a predetermined selection of the leads 3014.

In this example, the package encapsulation 2902 covers the second integrated circuit die 3008 and exposes both a bottom horizontal portion and a top horizontal portion of the leads 3014. The package encapsulation 2902 also exposes the die-attach paddle 2910 and the inner encapsulation 2913. The bottom horizontal portion of the leads 3014 function as the external interconnects 2904 and coplanar with the exposed portion of the die-attach paddle 2910.

Figure 31:
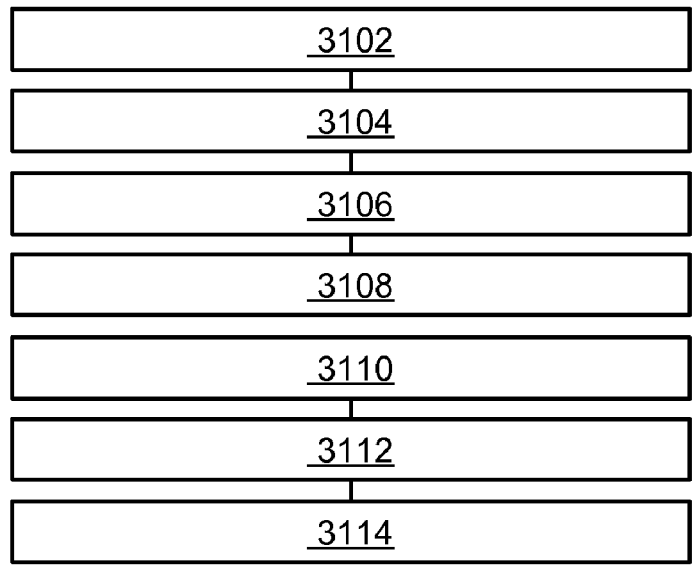
FIG. 31 is a first detailed flow chart of an integrated circuit package-in-package system for manufacturing of the integrated circuit package-in-package system in an embodiment of the present invention.

Referring now to FIG. 31, therein is shown a first detailed flow chart of an integrated circuit package-in-package system 3100 for manufacturing the integrated circuit package-in-package system 100 in an embodiment of the present invention. The system 3100 includes connecting a first integrated circuit die and a lead inside an integrated circuit package system in strip form in a block 3102; forming an inner encapsulation for the integrated circuit package system in strip from in a block 3104; isolating and pre-forming lead of the integrated circuit package system in strip form in a block 3106; optionally testing the integrated circuit package system in strip form in a block 3108; mounting a second integrated circuit die to the integrated circuit package system in strip form in a block 3110; forming a package encapsulation for the integrated circuit package-in-package system in strip form in a block 3112; and singulating integrated circuit package-in-package from the strip form in a block 3114.

Figure 32:
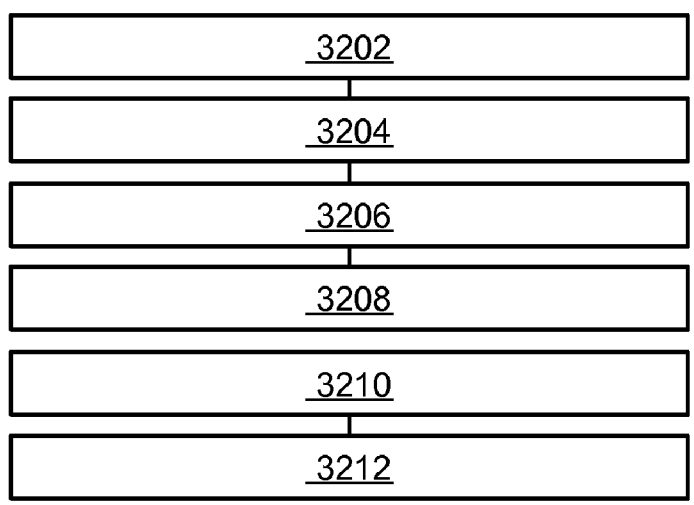
FIG. 32 is a second detailed flow chart of an integrated circuit package-in-package system for manufacturing of the integrated circuit package-in-package system in an embodiment of the present invention.

Referring now to FIG. 32, therein is shown a second detailed flow chart of an integrated circuit package-in-package system 3200 for manufacturing the integrated circuit package-in-package system 100 in an embodiment of the present invention. The system 3200 includes assembling, forming, singulating and testing an integrated circuit package system in a block 3202; picking and placing the integrated circuit package system onto a carrier strip with coverlay tape in a block 3204; mounting a second integrated circuit die to the integrated circuit package system in a block 3206; forming a package encapsulation for the integrated circuit package-in-package system on coverlay tape in a block 3208; removing coverlay tape in a block 3210; and singulating integrated circuit package-in-package system from the carrier strip in a block 3212.

Figure 33:
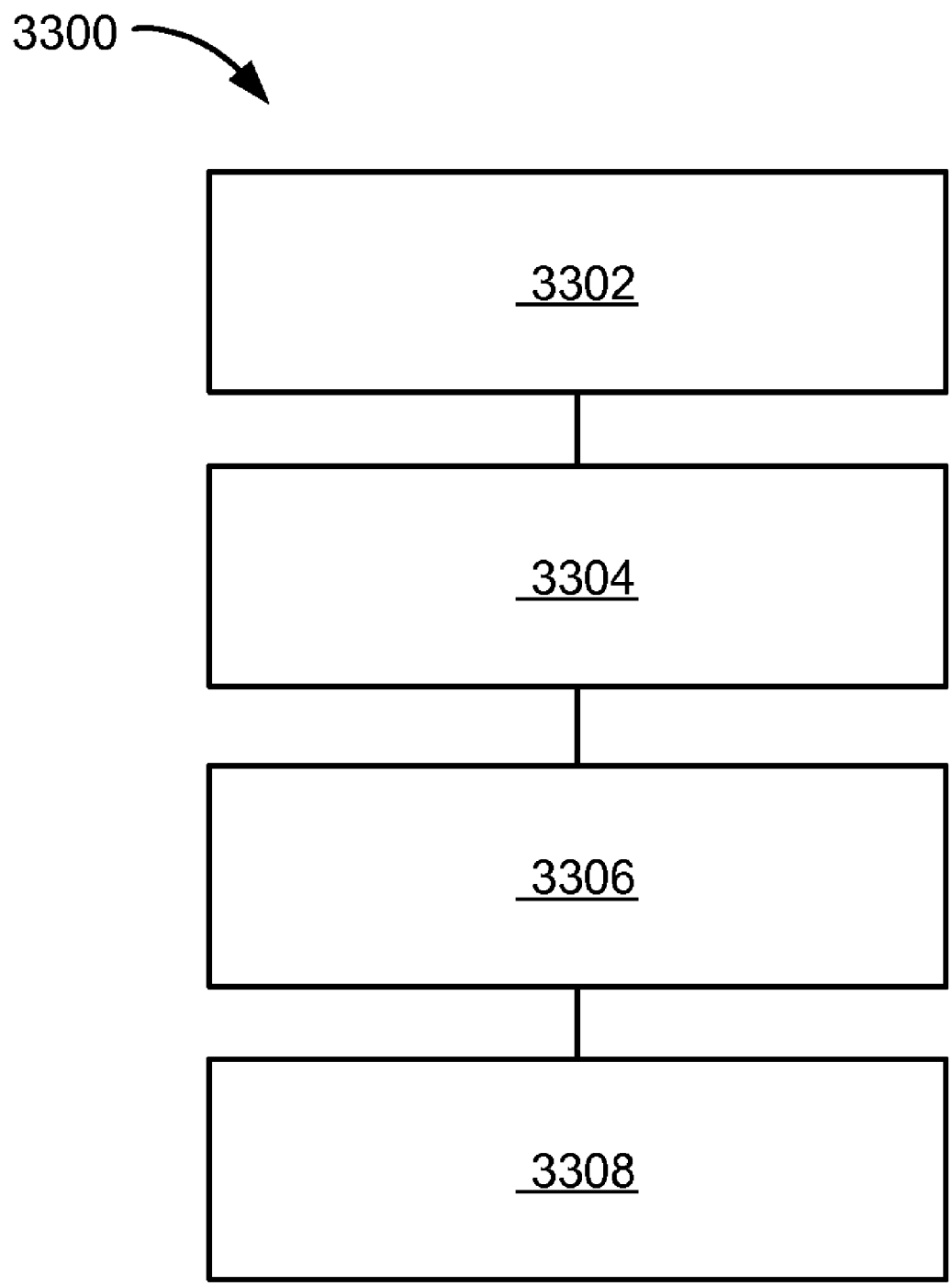
FIG. 33 is a flow chart of an integrated circuit package-in-package system for manufacturing of the integrated circuit package-in-package system in an embodiment of the present invention.

Referring now to FIG. 33, therein is shown a flow chart of an integrated circuit package-in-package system 3300 for manufacturing the integrated circuit package-in-package system 100 in an embodiment of the present invention. The system 3300 includes forming an integrated circuit package system including: connecting a first integrated circuit die and a lead, and forming an inner encapsulation covering the first integrated circuit die and a portion of the lead in a block 3302; mounting a second integrated circuit die to the integrated circuit package system in a block 3304; connecting the second integrated circuit die and the lead in a block 3306; and forming a package encapsulation covering the integrated circuit package system and the second integrated circuit die with the lead exposed in a block 3308.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package-in-package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package-in-package system comprising:
    an integrated circuit package system including:
        a lead,
        a first integrated circuit die connected to the lead,
        a die-attach paddle having the first integrated circuit die mounted thereto, and
        an inner encapsulation having a recess, the inner encapsulation covering the first integrated circuit die and a first end of the lead;
    a second integrated circuit die mounted to the integrated circuit package system and connected to the lead includes an internal interconnect coupled to the lead beyond the inner encapsulation;

a wire between the second integrated circuit die and the lead; and a package encapsulation molded directly on the integrated circuit package system and the second integrated circuit die with the second end of the lead enclosed includes a surface of the second end of the lead exposed and coplanar with the package encapsulation, the inner encapsulation is exposed from the package encapsulation.

2. The system as claimed in claim 1 wherein the integrated circuit package system includes a die-attach paddle exposed by the inner encapsulation with the first integrated circuit die mounted to the die-attach paddle.

3. The system as claimed in claim 1 wherein the second integrated circuit die is mounted in the recess.

4. The system as claimed in claim 1 wherein:

the integrated circuit package system includes:
- a die-attach paddle exposed by the inner encapsulation with the first integrated circuit die mounted to the die-attach paddle; and the second integrated circuit die mounted to the integrated circuit package system includes:
- the second integrated circuit die mounted to the die-attach paddle.

5. The system as claimed in claim 1 wherein the package encapsulation covering the integrated circuit package system and the second integrated circuit die with the lead exposed includes the lead exposed at both a top side and a bottom side of the package encapsulation.

6. The system as claimed in claim 1 wherein:

the die-attach paddle is exposed from the inner encapsulation; and the lead is coplanar with the exposed portion of the die-attach paddle.

7. The system as claimed in claim 1 wherein the package encapsulation covering the integrated circuit package system and the second integrated circuit die with the lead exposed includes the lead exposed at both a bottom side and a vertical side of the package encapsulation.

8. The system as claimed in claim 1 wherein the die-attach paddle is exposed from the package encapsulation.

* * * * *